US005223657A

United States Patent [19]

Takeuchi

[11] Patent Number: 5,223,657

[45] Date of Patent: Jun. 29, 1993

[54] MUSICAL TONE GENERATING DEVICE WITH SIMULATION OF HARMONICS TECHNIQUE OF A STRINGED INSTRUMENT

[75] Inventor: Chifumi Takeuchi, Hamamatsu, Japan

[73] Assignee: Yamaha Corporation, Hamamatsu, Japan

[21] Appl. No.: 658,556

[22] Filed: Feb. 21, 1991

[30] Foreign Application Priority Data

Feb. 22, 1990 [JP] Japan .................................. 2-41830

[51] Int. Cl.[5] .......................... H03G 3/00; G10H 1/12

[52] U.S. Cl. .......................................... 84/661; 84/615; 84/630; 84/DIG. 9; 84/DIG. 10; 84/DIG. 26; 381/63

[58] Field of Search .......... 84/661, DIG. 9, DIG. 10, 84/DIG. 30, 659, 630, 707, 615, DIG. 26; 381/63

[56] References Cited

U.S. PATENT DOCUMENTS

| | | | |
|---|---|---|---|
| 3,838,202 | 9/1974 | Nakada | 84/661 |
| 4,248,120 | 2/1981 | Dickson | 333/141 |
| 4,815,354 | 3/1989 | Kunimoto | 84/DIG. 9 |
| 4,852,444 | 8/1989 | Hoover et al. | 84/DIG. 10 |
| 4,984,276 | 1/1991 | Smith | 84/630 |

FOREIGN PATENT DOCUMENTS 58-48109 10/1983 Japan .

*Primary Examiner*—William M. Shoop, Jr.
*Assistant Examiner*—Helen Kim
*Attorney, Agent, or Firm*—Graham & James

[57] ABSTRACT

A musical tone generating device is capable of simulating various special playing techniques for a stringed instrument in which the harmonic spectrums of produced sound is enhanced, or otherwise altered. The device includes a delay circuit wherein an input signal thereto is delayed and output; a closed loop circuit comprising multiple feedback pathways to which the output of the delay circuit is supplied and processed therein, after which the processed signal is returned toward the delay circuit as an input signal; an excitation device in response to a predetermined control signal, generating an excitation signal and supplying it to the closed loop circuit, such that the excitation signal corresponds to an excitation vibration in the stringed instrument being simulated; and a control device wherein the predetermined control signal is generated and whereby the delay interval of the delay circuit and the processing carried out in the multiple feedback pathways are controlled.

9 Claims, 5 Drawing Sheets

MUSICAL TONE GENERATING DEVICE WITH SIMULATION OF HARMONICS TECHNIQUE OF A STRINGED INSTRUMENT

BACKGROUND OF THE INVENTION

1. Field of the Invention

The present invention pertains to musical tone generating device, and more particularly, to musical tone generating devices applicable to simulation of the sound of plucked string-instruments and rubbed string-instruments.

2. Prior Art

Various conventional musical tone generating devices exist, wherein tone generation elements thereof utilize waveform data stored in waveform memory for the generation of musical tones. The waveform data stored in waveform memory most commonly consists of digital representations of a plurality of fundamental waveforms. The data corresponding to one or more fundamental waveforms can be modified, combined and otherwise manipulated so as to generate any of a great number of more complex waveforms, whereby generation of a great variety of musical tones and simulation of many types of conventional non-electronic instruments become possible. Although considerably versatile, this variety of conventional musical tone generating device has certain limitations when applied to simulation of the sound of plucked string-instruments such as the guitar, or rubbed string-instruments such as the violin or cello. In particular, techniques entailing the use of feedback, and certain techniques effecting alteration of the harmonic spectrum of sound produced by a stringed instrument are not readily simulated with this type of conventional tone generating device.

In the repertoire of violinists, guitarists, and musicians playing certain other stringed instruments, special techniques exist whereby performers playing these stringed instruments can produce particular tonal and pitch variations. An example of such a technique is the harmonics playing method, wherein by lightly touching one or more strings at a position which is located at a point along the respective string or strings separated from the upper or lower fixation point thereof by a distance which is an integral fraction of the total length of the respective string or strings, i.e. $\frac{1}{2}$, $\frac{1}{3}$, $\frac{1}{4}$, . . . of the total length thereof, variations in the harmonic makeup of the produced tones can be achieved when the corresponding string or strings are plucked or played with a bow. That is to say, a node is produced in the vibration of each string played in this way, whereby the intensity of the fundamental pitch and the intensity of particular harmonics of the fundamental pitch of the string or strings being played in this way are augmented or diminished.

In the above discussion, the lower fixation point of a string generally refers to where the string meets the bridge, whereas the upper fixation point refers to where the string meets the nut at the upper end of the finger board in the case of an open string. With a closed string, that is, a string which is being fingered and therefore has a fundamental pitch higher than that when the same string is open, the upper fixation point refers to the lowest fret against which the string is held in the case of a guitar, and the point on the finger board against which the string is being held in the case of a fretless instrument such as a violin.

Returning to the discussion of the harmonic playing method from a mechanistic point of view, a portion of vibrational waves propagating along a given string from the direction of the bridge of the instrument are reflected when they reach the point where the performer's finger is lightly in contact with the string, after which the reflected vibrational waves travel back again toward the bridge. The portion of the vibrational waves which travel past where the performer's finger is lightly in contact with the string continue as far as the upper fixation point of the string where they are then reflected downward in the direction of the bridge. A portion of the vibrational waves reflected downward from the upper fixation point are again reflected upward when they meet the performer's lightly touching finger, whereas the remainder continue on to the bridge. In this way three pathways are effectively formed over which vibrational waves circulate back and forth mutually interacting and interfering with one another, namely, the pathway formed between the upper fixation point and the lower fixation point, the pathway formed between the upper fixation point and the performer's lightly touching finger, and the pathway formed between the performer's lightly touching finger and the lower fixation point.

It can be seen from the above discussion that by employing techniques such as the harmonic playing method, in each string of a stringed instrument being played according to the method, the performer in effect establishes multiple pathways over which vibrational waves propagate and hence circulate. In that each pathway thus established in a given string shares a portion of its course with a portion of at least one other pathway in that string, each pathway in the string is in effect coupled either directly or indirectly with all of the other pathways formed in that string. In this way, constructive and destructive interaction takes place between the waves circulating in any pathway and those circulating in all of the other pathways of a given string, thereby leading to a rich harmonic spectrum in the audible tones finally created.

In addition to the above described harmonic playing method for stringed instruments, various other techniques and situation exist whereby coupling or feedback pathways are established. One example of such is the electric guitar, wherein the vibrations of strings being played are picked up with one or more magnetic pickups and converted therein to an electrical signal. The electrical signal is subsequently amplified and then output from one or more speakers as audible sound which can interact with the strings of the same guitar if sufficiently loud at the position where the guitar is located. At lower volumes, various types of interaction occur between the output of the speakers and the vibrating strings as well as other strings not damped by the performers hand, whereby alterations in the harmonic spectrum of the sound produced are generated. At a sufficiently high amplitude and if the speakers are sufficiently close to the guitar, a feedback loop is established leading to the generation of an oscillating component at a characteristic frequency which is included in the output signal from the guitar and amplified, thereby producing howling in the output of the speakers.

Due to the complexity and great variety of the underlying mechanisms whereby the above described special effects are achieved, these effects cannot readily be simulated using conventional musical tone generating devices which utilize waveform data for the generation of musical tones. Moreover, as stated in the Nyquist theorem, sampling of waveform data must be carried out at a rate twice the frequency of the highest frequency of which production thereof is desired. Accordingly, faithful reproduction of the harmonic spectrum produced by techniques such as the harmonic method requires sampling of waveform data at a very high rate in order to reproduce the highest frequency components thereof. For this reason, such a device would be considerably expensive due to need for additional processing power, high speed D/A converters and the like.

Additionally, using waveform data to simulate, for example, the above described harmonic method requires several times more waveform data than that of the conventional playing method for the same instrument. For which reason, in addition to the matters described in the preceding paragraph, implementation of such a device becomes very expensive.

SUMMARY OF THE INVENTION

In consideration of the limitations inherent to conventional devices for simulating the sound of stringed instruments, it is an object of the present invention to provide a musical tone generating device such that for when harmonic techniques, feedback techniques and the like are applied to plucked string-instruments and rubbed string-instruments, the sound produced thereby can be faithfully reproduced, including the enhanced harmonic and subharmonic spectrum achieved by these playing techniques.

So as to achieve the above object, the present invention provides a musical tone generating device which includes delay means wherein an input signal thereto is delayed and output therefrom; closed loop means comprising multiple feedback pathways (to which the output of the delay means is supplied) and processed therein according to predetermined processing, after which the processed signal is returned toward the delay means as an input signal thereto; excitation means wherein in response to a predetermined control signal, an excitation signal is generated and supplied to the closed loop means, such that the excitation signal corresponds to an excitation vibration in the stringed instrument being simulated; and control means wherein the predetermined control signal is generated and whereby the delay interval of the delay means and the predetermined processing carried out in the multiple feedback pathways are controlled.

In the musical tone generating device of the present invention as thus described, the control means acts to generate a control signal in response to which the excitation signal is generated in the excitation means, and then supplied to the closed loop means. Additionally, the control means acts to control the delay interval in the delay means, as well as the predetermined processing which is carried out in the multiple feedback pathways. In response to the above operations, one or more drive signals (circuitous signals) circulate through the delay means and multiple feedback pathways.

Thus, with the musical tone generating device of the present invention, the sound produced through application of harmonic techniques, feedback techniques and the like to stringed instruments can be faithfully reproduced, including the enhanced harmonic and subharmonic spectrum achieved by these playing techniques.

DETAILED DESCRIPTION OF THE PREFERRED EMBODIMENTS

I. First Preferred Embodiment

In the following section, a first preferred embodiment of the present invention will be described with reference to FIGS. 1 through 4.

Figure 1:
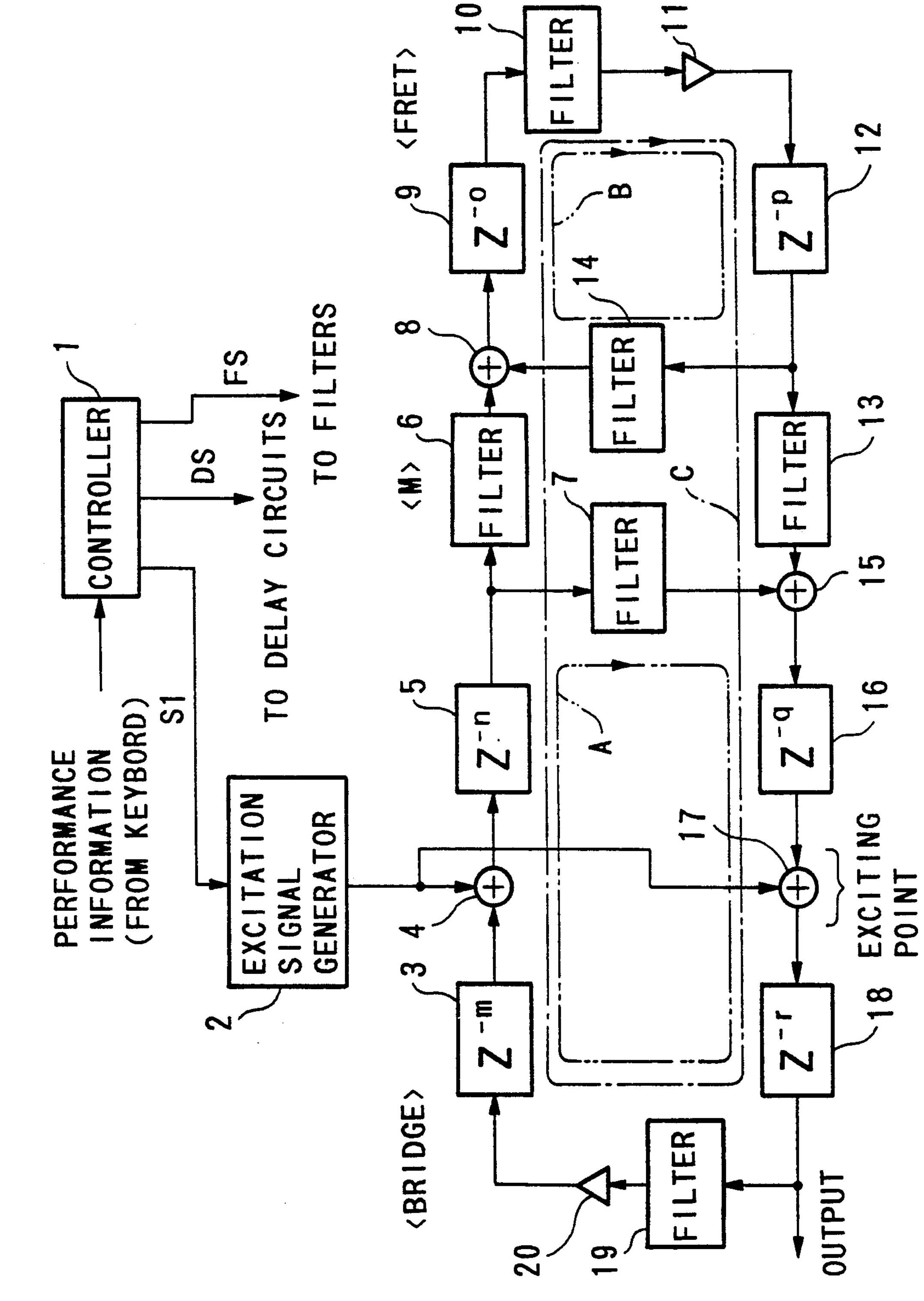
FIG. 1 is a block diagram illustrating the general layout of a musical tone generating device in accordance with a first preferred embodiment of the present invention.

FIG. 1 is a block diagram illustrating this first preferred embodiment of the present invention. In the diagram, a controller 1 can be seen to which performance data is supplied from a keyboard (not shown in the drawing) or other type of input device. In response to performance data from the input device, controller 1 generates a control signal S1 which is then supplied to an excitation signal generator 2, wherein an excitation signal is generated based on the supplied control signal S1. In addition to control signal S1, controller 1 also generates and outputs a delay signal DS, on which basis the delay intervals in delay circuits 3, 5, 9, 12, 16 and 18 are set. Moreover, a filter control signal FS is also output from controller 1, upon which basis the filter characteristics of filters 6, 7, 10, 13, 14 and 19 are set. The excitation signal generated in excitation signal generator 2 in response to control signal S1 is supplied to adders 4 and 17.

As shown in FIG. 1, multiple partially overlapping closed loops are formed by delay circuit 3, adder 4, delay circuit 5, filters 6 and 7, adder 8, delay circuit 9, filter 10, multiplier 11, delay circuit 12, filters 13 and 14, adder 15, delay circuit 16, adder 17, delay circuit 18, filter 19, multiplier 20 and the interconnections therebetween. The combination of closed loops thus formed together represent one string of a stringed instrument.

Figure 2:
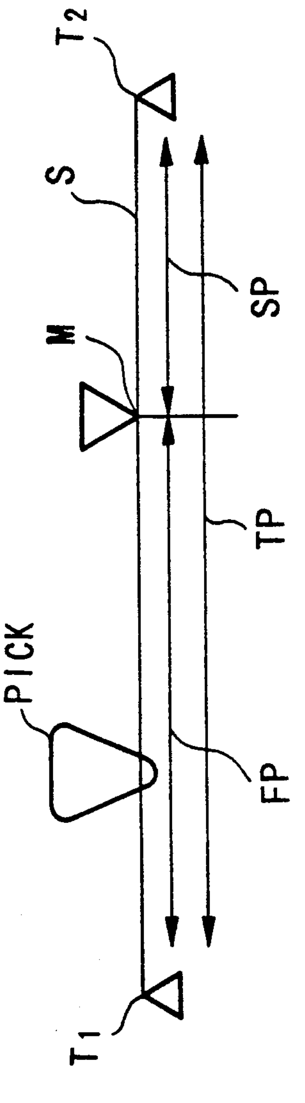
FIG. 2 is a diagram for illustrating the mechanism of an excitation vibration in a string of a guitar.

In order to facilitate understanding of the combination of closed loops described above and simulation of a stringed instrument through operation thereof, a schematic diagram illustrating the mechanism of sound generation of a single guitar string played by the harmonic method is shown in FIG. 2. In this diagram, a string S, lower fixation point T1 and upper fixation point T2 can be seen. At an intermediate point M between lower fixation point T1 and upper fixation point T2 on string S, a performer's finger lightly touches string S so as to achieve the harmonic method mode of playing when the string is plucked with a pick at a point intermediate between the performer's lightly touching finger at M and the lower fixation point T1. Intermediate point M is chosen such that it is located at a point separated from the upper fixation point T2 by a distance which is an integral fraction of the total length of string S, that is, ½, ⅓, ¼, . . . of the total length of string S.

Referring again to FIG. 2, when string S is plucked by the pick shown between lower fixation point T1 and intermediate point M where the performer's finger is lightly touching, a vibrational wave propagates upward from lower fixation point T1, and continues to propagate repetitiously over string S, reflecting to return in the opposite direction after reaching lower fixation point T1 or upper fixation point T2, and portions thereof traveling past while other portions thereof are reflected after reaching the performer's lightly touching finger at intermediate point M from either direction. In this way, a first pathway is formed between lower fixation point T1 and intermediate point M, a second pathway is formed between intermediate point M and upper fixation point T2, and a third pathway is formed between lower fixation point T1 and upper fixation point T2, with vibrational waves propagating over each of these pathways and interacting at the overlapping portions thereof. From the above discussion, it can seen that when the harmonic method is employed, the performer's lightly touching finger acts to form a node in the waves propagating over string S. When this node is located at a point separated from the upper fixation point T2 by a distance which is an integral fraction of the total length of string S, various types of constructive and destructive interactions occur between the waves propagating over first pathway FP, second pathway SP and third pathway TP, whereby the harmonic spectrum of the sound produced by the vibrating string is altered.

The above described mechanism operative in string S when played according to the harmonic method is simulated by the circuit shown in FIG. 1. More particularly, filter 19 and multiplier 20 together correspond to lower fixation point T1, such that reduction of amplitude which occurs at lower fixation point T1 is simulated based on the filter characteristics of filter 19 and the phase reversal at lower fixation point T1 is simulated by multiplier 20. Similarly, filter 10 and multiplier 11 together correspond to upper fixation point T2 through the same mechanisms. Adders 4 and 17 serve as a drive point which simulates the point at which the pick acts on string S. Thus, based on an excitation signal supplied from excitation signal generation circuit 2, adders 4 and 17 act to simulate the effect of the pick as it imparts mechanical energy to string S. Finally, filters 6 and 7, adder 8, filters 13 and 14, and adder 15 together function so as to simulate the performer's lightly touching finger at intermediate point M.

Delay circuits 5 and 16 correspond to the time interval required for traveling waves to propagate from the pick to intermediate point M, and for reflected waves to propagate from intermediate point M back to the pick, respectively. Delay circuits 9 and 12 correspond to the time interval required for traveling waves to propagate from intermediate point M to upper fixation point T2, and for reflected waves to propagate from upper fixation point T2 back to intermediate point M, respectively. Delay circuits 3 and 18 correspond to the time interval required for reflected waves to propagate from lower fixation point T1 to the pick, and for traveling waves to propagate from the pick to lower fixation point T1, respectively. Accordingly, loops A, B and C in FIG. 1 correspond to pathways FP, SP and TP, respectively, in the guitar string shown in FIG. 2. From another viewpoint, filters 7, 14, 10 and 19 can be considered to function as feedback pathways for feedback loops A, B in the circuit shown in FIG. 1 as a whole.

The time-dependent frequency-characteristics of waves traversing past and reflected at the performer's lightly touching finger at intermediate point M can be effectively simulated through control of the frequency-characteristics of filters 6, 7, 13 and 14 by the filter control signal FS supplied from controller 1. This operation can be accomplished much more easily, however, through use of the circuit shown in FIG. 3(*a*). In this circuit, filters 21 and 21 are identical. The gain coefficients of multipliers 22, 23, 24 and 25 are given by $1-|K|$, K, K and $1-|K|$, respectively. In the present embodiment, K varies with respect to time so as to express the relative contribution to the time-dependent frequency-characteristics of the vibrating string S by waves propagating past intermediate point M, and those reflected at intermediate point M. Acceptable values for K lie within a range from one to zero, where a value of one for K represents the hypothetical limiting situation in which all waves reaching the lightly touching finger at intermediate point M are reflected backwards toward the direction from whence they came.

When playing a guitar using the harmonic method, the performer ordinarily withdraws the lightly touching finger immediately after the corresponding string has been plucked. In the present embodiment, this is represented by having K drop from an initial value of somewhat less than one to a final value of zero, where $K=0$ represents the limiting situation in which the performer's finger has been completely withdrawn from string S, and thus, the situation in which all waves reaching intermediate point M continue past without any reflection of the propagating waves.

Figure 3B:
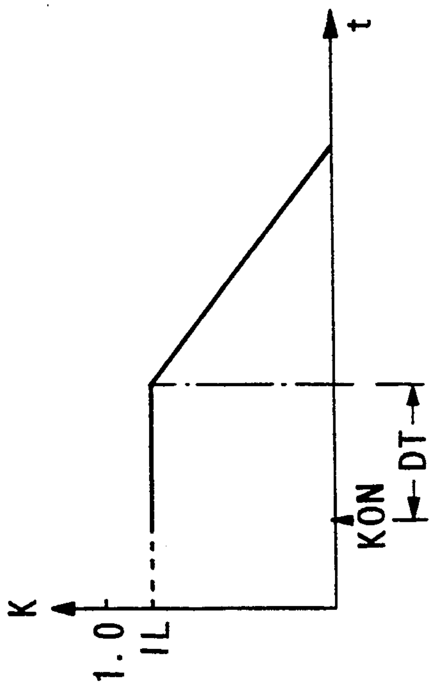
FIG. 3(*a*) is a circuit diagram showing a portion of the musical tone generating device shown in FIG. 1, and FIG. 3(*b*) is a graph illustrating variation of a coefficient K over time.
Figure 3A:
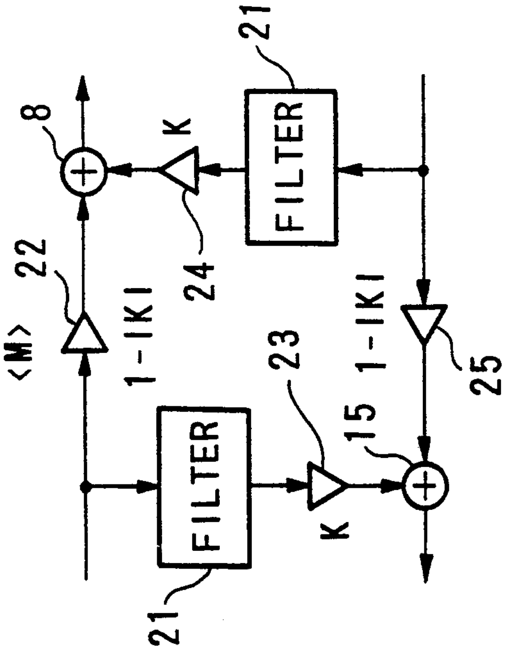

The above described characteristics of K are graphically represented in FIG. 3(*b*), wherein the vertical axis corresponds to K, IL being the initial level of K. After a key-on (KON) signal has been issued, following a time interval DT, K decreases toward a final value of zero, changing linearly with respect to time. Over the time interval DT following the KON signal wherein the value of K is close to one, the gain coefficients of multipliers 23 and 24 are similarly close to one, in that both gain coefficients are equal to K. Conversely, because the gain coefficients of multipliers 22 and 25 are both equal to $1-|K|$, over the same time interval, the gain coefficients of multipliers 22 and 25 are both small positive values, slightly larger than zero. From the above discussion, it can be seen that over the interval DT, the largest portion of the signal traverses multipliers 23 and 24, and hence filters 21, 21. For this reason, the filter characteristics of filters 21, 21 are most prominent over the interval DT, as reflected in the output of the circuit shown in FIG. 3(*a*). In contrast, as the value of K approaches zero following the time interval DT, the portion of the signal traversing multipliers 23 and 24 gradually decreases, whereas the portion of the signal traversing multipliers 22 and 25 gradually increases. Accordingly, the effect of filters 21, 21 becomes less and less dominant, and when the value of K has finally reached zero, filters 21, 21 exert no effect at all on the output of the circuit shown in FIG. 3(*a*).

Figure 4A:
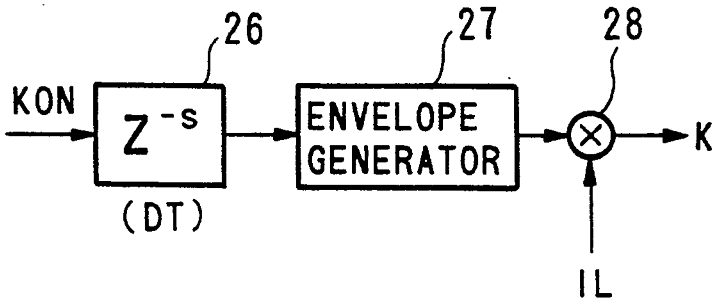
FIG. 4(*a*) is a circuit diagram showing a portion of the musical tone generating device shown in FIG. 1 involved with the generation of coefficient K, and FIG. 4(*b*) is a graph illustrating the output of an envelope generator employed in the musical tone generating device shown in FIG. 1.
Figure 4B:
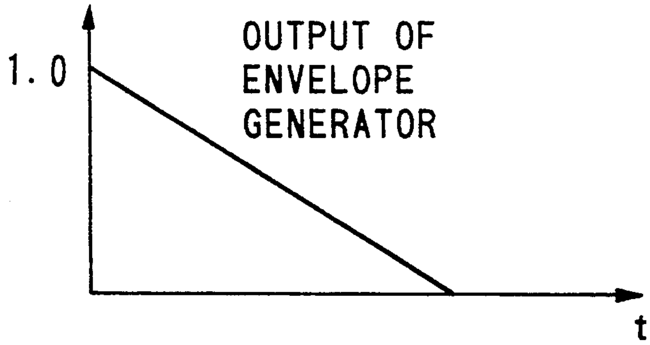

In FIG. 4 (a parameter generating circuit is shown which can be used to generate a signal which expresses the above described characteristics of K. This envelop generator circuit is incorporated as a component of controller 1 shown in FIG. 1. In FIG. 4(*a*), a delay circuit 26, to which KON signals from a keyboard (not shown), or some other type of input device are supplied. Delay circuit 26 has a delay interval which is equal to interval DT discussed above and shown in FIG. 3(*b*). The signal output from delay circuit 26 after delay interval DT is then supplied to an envelope generator circuit 27, whereupon the envelope shown in FIG. 4(*b*) is output therefrom and supplied to multiplier 28. In multiplier 28, the signal applied thereto is multiplied by a suitable gain coefficient and output, such that the amplitude of the envelope is equal to initial level IL shown in FIG. 3(*b*). In other words, the envelope signal output from multiplier 28 is equivalent to K.

II. Operation of the First Preferred Embodiment

In the following section, the operation of the above described first preferred embodiment of the present invention will be explained.

With this device, performance data such as a KON signal is output from a keyboard or the like when a key thereon is depressed, and the performance data is supplied to controller 1. From controller 1, the previously described control signal S1, delay signal DS and filter signal FS are output. As an alternative to filter signal FS when the circuit shown in FIG. 3(*a*) is employed, after interval DT, K is output as an envelope signal from the parameter generating circuit contained within controller 1, made up of delay circuit 26, envelope generator circuit 27 and multiplier 28. Having received control signal S1, excitation signal generator 2 outputs an excitation signal which is supplied to the closed loop circuit via adders 4 and 17. As previously described, the excitation signal supplied via adders 4 and 17 then circulates within loops A, B and C, wherein the signal circulating in each loop interacts with the signal circulating in each of the other two loops, whereby various types of constructive and destructive interference take place. The delay interval of delay circuits 3, 5, 9, 12, 16 and 18 is controlled based on the delay signal DS supplied thereto. The gain coefficients of multipliers 22, 23, 24 and 25 shown in FIG. 3(*a*) are controlled based on the value of K supplied thereto. A musical output signal can then be output from the closed loop circuit, for example, from between delay circuits 18 and 19 as is shown in FIG. 1. If the value of K is held constant over time at zero, then filters 21, 21 have no effect, such that sound resulting from operation of the musical tone generating device simulates the sound of the guitar, violin, etc. when played using a conventional technique, that is, played without using the harmonic technique.

III. Variation on the First Preferred Embodiment

In the following section, a variation on the first preferred embodiment of the present invention will be described with reference to FIGS. 5(*a*) and 5(*b*).

Figure 5A:
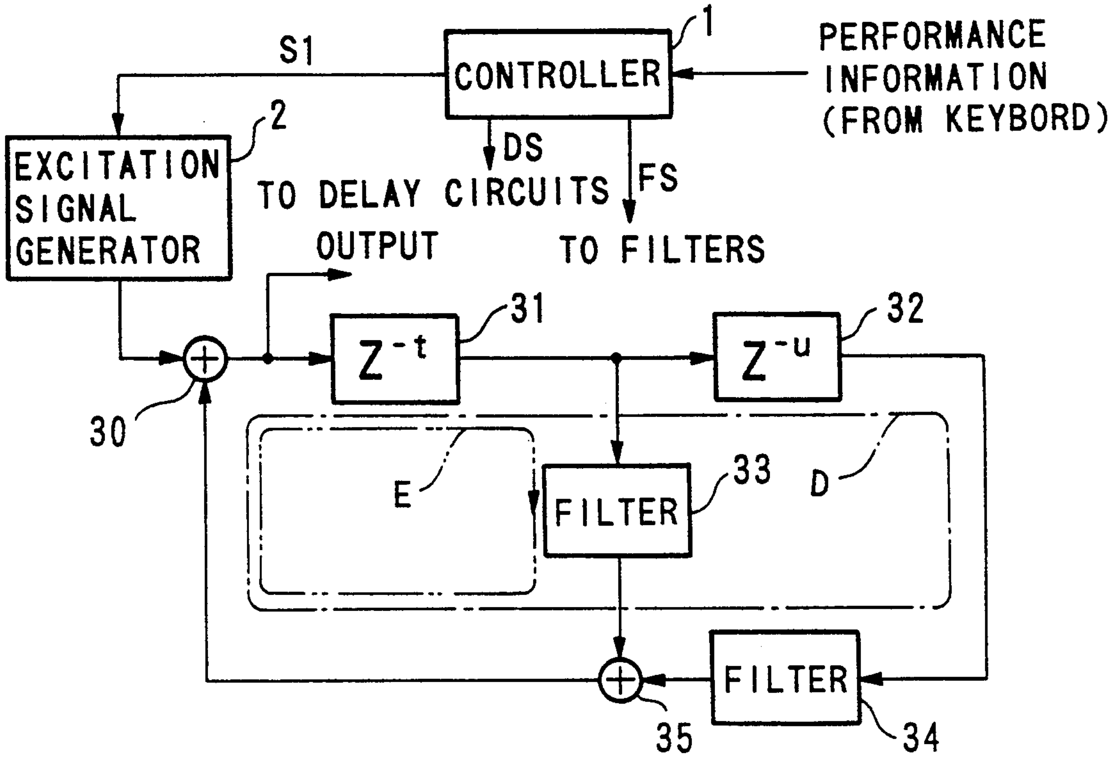
FIG. 5(*a*) is a block diagram showing a first variation of the musical tone generating device shown in FIG. 1, and FIG. 5(*b*) is a circuit diagram illustrating a portion of the musical tone generating device shown in FIG. 5(*a*).
Figure 5B:
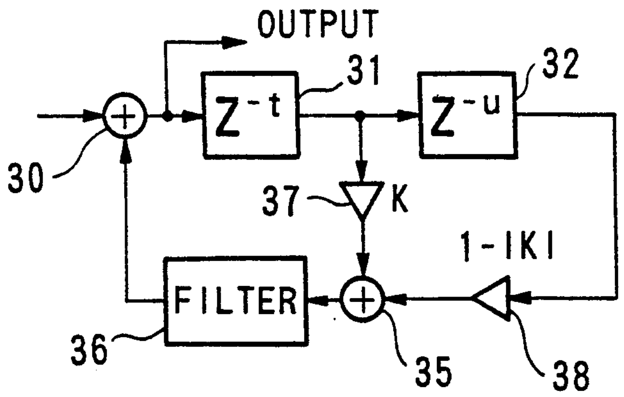

FIG. 5(*a*) is a block diagram illustrating this variation on the first preferred embodiment of the present invention. Every component in FIG. 5(*a*) which corresponds exactly to a component in the device shown in FIG. 1 will retain the original identifying number, and description thereof will be abbreviated.

The device shown in FIG. 5(*a*) is characterized in that, when simulating the harmonic playing method, simulation of the effect attributable to the loop formed between the upper fixation point and the performer's lightly touching finger is omitted due to the fact that in the instrument being simulated, this loop has little effect on the sound actually produced. Additionally, the method of driving the circuit has been simplified, compared with the device shown in FIG. 1. In FIG. 5(*a*), delay circuits 31 and 32 can be seen, whereby based on the ratio of the delay interval of each of these delay circuits, the position of intermediate point M at which the performer's finger lightly touches is set for the instrument being simulated. In this circuit, feedback loop E created by filter 33 simulates the effect of waves reflected by the performer's finger at intermediate point M, and feedback loop D created by filter 34 simulates the effect of waves which propagate past intermediate point M and which are then reflected at upper fixation point T2. The output of filters 33 and 34 is supplied to adder 35, where adder 35 corresponds to adder 15 shown in FIG. 1. The result of the addition operation in adder 35 is then supplied to adder 30.

Similar to the device of FIG. 1, with the device shown in FIG. 5(*a*) presently being discussed, rather than directly controlling the filter characteristics of filters 33 and 34, the time dependent frequency characteristics of waves traversing past and reflected at the performer's lightly touching finger at intermediate point M can be effectively simulated by means of the circuit shown in FIG. 5(*b*). In the present example, the output of filters 33 and 34 are supplied to filter 36 via adder 35. The gain coefficients of multipliers 37 and 38 shown in FIG. 5(*b*) are K and $1-|K|$, respectively.

With this variation of the first preferred embodiment as thus described, performance data such as a KON signal output from a keyboard or the like is supplied to controller 1. From controller 1, the previously described control signal S1, delay signal DS and filter signal FS are output. As an alternative to filter signal FS when the circuit shown in FIG. 5(*b*) is employed, after interval DT, K is output as an envelope signal from the parameter generating circuit contained within controller 1, made up of delay circuit 26, envelope generator circuit 27 and multiplier 28. Having received control signal S1, excitation signal generator 2 outputs an excitation signal which is supplied to the closed loop circuit via adder 30. The excitation signal supplied via adder 30 then circulates within loops D and E, wherein the signal circulating in each loop interacts with the signal circulating in the other loop, whereby various types of constructive and destructive interference take place. The delay interval of delay circuits 31 and 32 is controlled based on the delay signal DS supplied thereto. The gain coefficients of multipliers 37 and 38 shown in FIG. 5(*b*) are controlled based on the value of K supplied thereto. A musical output signal can then be output from the closed loop circuit, for example, from between adder 30 and delay circuit 31 as is shown in FIG. 5(*b*).

IV. Second Variation on the First Preferred Embodiment

In the following section, a second variation on the first preferred embodiment of the present invention will be described with reference to FIG. 6.

Figure 6:
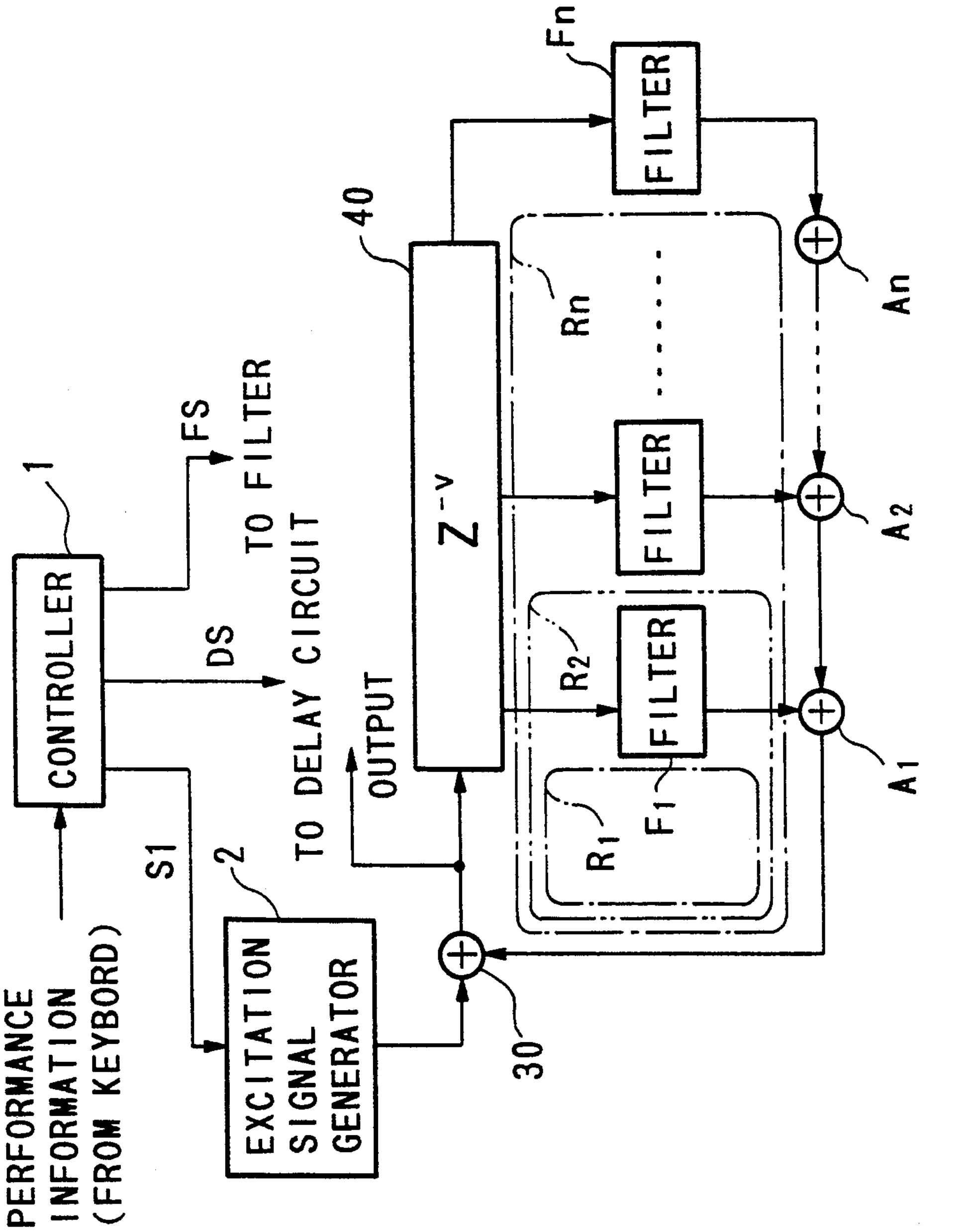
FIG. 6 is a block diagram showing a second variation of the musical tone generating device shown in FIG. 1.

FIG. 6 is a block diagram illustrating this second variation on the first preferred embodiment of the present invention. Every component in FIG. 6 which corresponds exactly to a component in the device shown in FIG. 1 will retain the original identifying number, and description thereof will be abbreviated.

The device shown in FIG. 6 encompasses further refinements of the first variation as shown in FIG. 5(*a*), namely, multiple feedback loops R1 through Rn are incorporated therein, where n is the total number of feedback loops Ri(i=1~n). In FIG. 6, a delay circuit 40 can be seen, where delay circuit 40 consists of multiple delay stages, delay stage D1 through delay stage Dn. The output of each delay stage D1 through delay stage Dn is supplied to a corresponding filter, filter F1 through filter Fn, the output of each of which is supplied to a corresponding adder, adder A1 through adder An. Each adder Ai sums the output of the corresponding filter Fi supplied thereto with the output of adder Ai+1, in other words, the result of the addition operation in each adder Ai is the sum of the output of each filter Fi through Fn. The output of adder A1 is supplied to adder 30. Based on the above discussion, it can be seen that any feedback loop Ri among the above mentioned feedback loops R1 through Rn is formed by a corresponding delay stage Di, filter Fi and adder Ai, together with adder 30.

Similar to the device of the first preferred embodiment as shown in FIG. 1, and the first variation embodiment shown in FIG. 5(*a*), with the device shown in FIG. 6 presently being discussed, rather than directly controlling the filter characteristics of filters F1 through Fn, each filter incorporates an individual multiplier (not shown in the drawings), whereby the time dependent frequency characteristics of each filter is controlled by adjustment of the gain coefficient of the corresponding multiplier based on the filter signal FS supplied thereto.

With this variation of the first preferred embodiment as thus described, performance data such as a KON signal output from a keyboard or the like is supplied to controller 1. From controller 1, the previously described control signal S1, delay signal DS and filter signal FS are output. As an alternative to filter signal FS, after interval DT, parameter K can be supplied to the multiplier component of each filter F1 through Fn as an envelope signal from the parameter generating circuit contained within controller 1. Having received control signal S1, excitation signal generator 2 outputs an excitation signal which is supplied to the closed loop circuit via adder 30. From adder 30, the excitation signal is then supplied to each filter Fi after having first traversed delay stages D1 through Di of delay circuit 40. The excitation signal then circulates within each feedback loop Ri among the above mentioned feedback loops R1 through Rn, wherein the signal circulating in each loop interacts with the signal circulating in each of the other loops, whereby various types of constructive and destructive interference take place. The delay interval of each delay stage R1 through Rn of delay circuit 40 is controlled based on the delay signal DS supplied thereto. The gain coefficient of the integral multiplier of each filter F1 through Fn is controlled based on the supplied filter signal FS. A musical output signal can then be output from the closed loop circuit, for example, from between adder 30 and delay circuit 40 as is shown in FIG. 6.

With the present invention as thus described in the first preferred embodiment and in the variation embodiments thereof, delay interval DT, initial level IL, as well as the waveform of the output of envelope generator 27 can be control necessary so as to achieve the desired effect. Additionally, the delay interval of delay elements in the feedback loops can be prolonged so as enhance subharmonics relative to the fundamental pitch thereof, whereby the sound of an electric piano can be effectively simulated.

Also, with the first and second variation embodiments, by setting the gain of the feedback loops greater than one, the effect of feedback generated while playing an electric guitar can be simulated, in which case the frequency of the exciting signal which leads to the feedback can be adjusted by adjusting the delay intervals. When such a feature is implemented, generally a limiter must be included in order to compress the volume range.

Additionally, by increasing the number of feedback loops, it becomes to generate an output signal which has a complex, irregular sawtooth type pattern (as IIR; Infinite Impulse Response digital filter), which can be used to create a large variety of unique and unusual sound effects.

What is claimed is:

1. A musical tone generating device including:

a) closed loop means, for circulating signals therein, comprising delay means and multiple feedback pathways, connected to form at least two partially overlapping closed loops each having different delay amounts, said delay means for delaying signals input thereto, said multiple feedback pathways for processing signals output from the delay means and returning the processed signals toward the delay means;

b) excitation means for generating an excitation signal in accordance with a control signal, wherein the excitation signal is supplied to said closed loop means; and c) control means for generating said control signal in response to a signal designating musical tone generation and for selectively controlling a total delay interval of said delay means and processing carried out by each of said multiple feedback pathways.

2. A musical tone generating device in accordance with claim 1, wherein said multiple feedback pathways, together with portions of said delay means, respectively form multiple closed loops which respectively circulate signals therein.

3. A musical tone generating device in accordance with claim 1, wherein said control means substantially concurrently carries out the generation of the control signal and the control of the processing in the multiple feedback pathways.

4. A musical tone generating device in accordance with claim 1, wherein said musical tone generating device simulates a sound of a stringed instrument, said excitation means simulates plucking of a string on the stringed instrument and feedback of a processed signal through at least one of the multiple feedback pathways simulates a vibration node in a vibrating string on the stringed instrument whereby said musical tone generating device simulates a harmonics technique of playing of the stringed instrument.

5. A musical tone generating device in accordance with claim 1, wherein said delay means further comprises first delay means being provided in one side of said closed loop means which is divided by at least one feedback pathway and second delay means being provided in another side of said closed loop means which is divided by at least one feedback pathway.

6. A musical tone generating device in accordance with claim 1, wherein at least one feedback pathway has a gain greater than one, wherein the frequency of the musical tone signal is adjusted by adjusting said delay intervals of said delay means.

7. A musical tone generating device in accordance with claim 1, wherein said multiple feedback pathways have delay intervals longer than that of said closed loop means so that musical tone containing sub-harmonics are generated.

8. A musical tone generating device in accordance with claim 1, wherein said control means comprises parameter generating means for generating a parameter whose value is varied with respect to time to control the processing of said feedback pathways.

9. A musical tone generating device in accordance with claim 8, wherein said multiple feedback pathways include level controlling means for changing the amplitude of respective signals applied to the feedback pathways in correspondence with said parameter from said control means.

* * * * *